United States Patent [19]

Krogh

[11] Patent Number: 5,451,259
[45] Date of Patent: Sep. 19, 1995

[54] ECR PLASMA SOURCE FOR REMOTE PROCESSING

[76] Inventor: Ole D. Krogh, 110 Point Lobos Ave., San Francisco, Calif. 94121

[21] Appl. No.: 198,524

[22] Filed: Feb. 17, 1994

[51] Int. Cl.$^6$ .............. C23C 16/30; C23C 16/50; H01L 21/00; H05H 1/00
[52] U.S. Cl. ............... 118/723 MR; 118/724; 204/298.37; 204/298.38; 156/345
[58] Field of Search ............. 118/723 MR, 723 MA, 118/724, 723 MW, 723 ME; 204/156.37, 298.38; 156/345, 643

[56] References Cited

U.S. PATENT DOCUMENTS

| | | | |
|---|---|---|---|
| 4,420,385 | 12/1983 | Hartsough | 204/192 |
| 4,433,228 | 2/1984 | Nishimatsu | 219/10.55 R |
| 4,483,737 | 11/1984 | Mantei | 156/643 |
| 4,745,337 | 5/1988 | Pichot | 315/111.41 |
| 4,851,095 | 7/1989 | Scobey | 204/192.12 |
| 4,876,983 | 10/1989 | Fukuda | 118/722 |
| 4,915,979 | 4/1990 | Ishida | 427/39 |
| 4,970,435 | 11/1990 | Tanaka | 315/111.21 |
| 5,032,202 | 7/1991 | Tsai | 156/345 |
| 5,032,205 | 7/1991 | Hershkowitz | 156/345 |
| 5,047,115 | 9/1991 | Charlet et al. | 156/643 |
| 5,115,166 | 5/1992 | Campbell | 315/111.21 |
| 5,196,670 | 3/1993 | Mantel | 219/121.43 |
| 5,206,471 | 4/1993 | Smith | 219/10.55 R |
| 5,254,171 | 10/1993 | Hayakawa et al. | 118/723 MR |
| 5,342,472 | 8/1994 | Imahashi et al. | 204/298.38 X |

FOREIGN PATENT DOCUMENTS

| | | |
|---|---|---|
| 57-5863 | 1/1982 | Japan . |
| 63-240013 | 10/1988 | Japan . |
| 1-36085 | 2/1989 | Japan . |
| 1-321625 | 12/1989 | Japan . |
| 4-107919 | 4/1992 | Japan . |
| 5-326415 | 12/1993 | Japan . |

OTHER PUBLICATIONS

Lax, Allis and Brown, "The Effect of Magnetic Field on the Breakdown of Gases at Microwave Frequencies", Journal of Applied Physics, vol. 21, pp. 1297–1304 (1950).

*Primary Examiner*—R. Bruce Breneman
*Assistant Examiner*—Jonathan D. Baskin
*Attorney, Agent, or Firm*—Robert Charles Hill

[57] ABSTRACT

An apparatus is described as a source of a plasma for remote, or downstream, processing with a variety of applications. The plasma is produced in a gas by cooperation between a magnetic field of the proper strength and microwave energy of the proper frequency. The microwave field enters a chamber through a window of microwave transparent material to encounter a magnetic field formed by a permanent magnet placed on the opposite side of the chamber and designed such that the direction of propagation of the microwave field is parallel with the magnetic field lines in the center of the chamber. A gas or gas mixture is introduced to the chamber and the plasma effluent is guided by gas pressure gradients to a workpiece located downstream from the source chamber. With the proper choice of gases, pressure, and power the workpiece or substrate can be effected by deposition of a thin film, etching of the substrate surface, or otherwise modifying the surface or body of the workpiece. The areas of technology intended to benefit from this invention include, but are not limited to semiconductors, superconductors, optical thin films, plasma sterilization, as well as other industrial methods involving surface treatment and modifications.

8 Claims, 1 Drawing Sheet

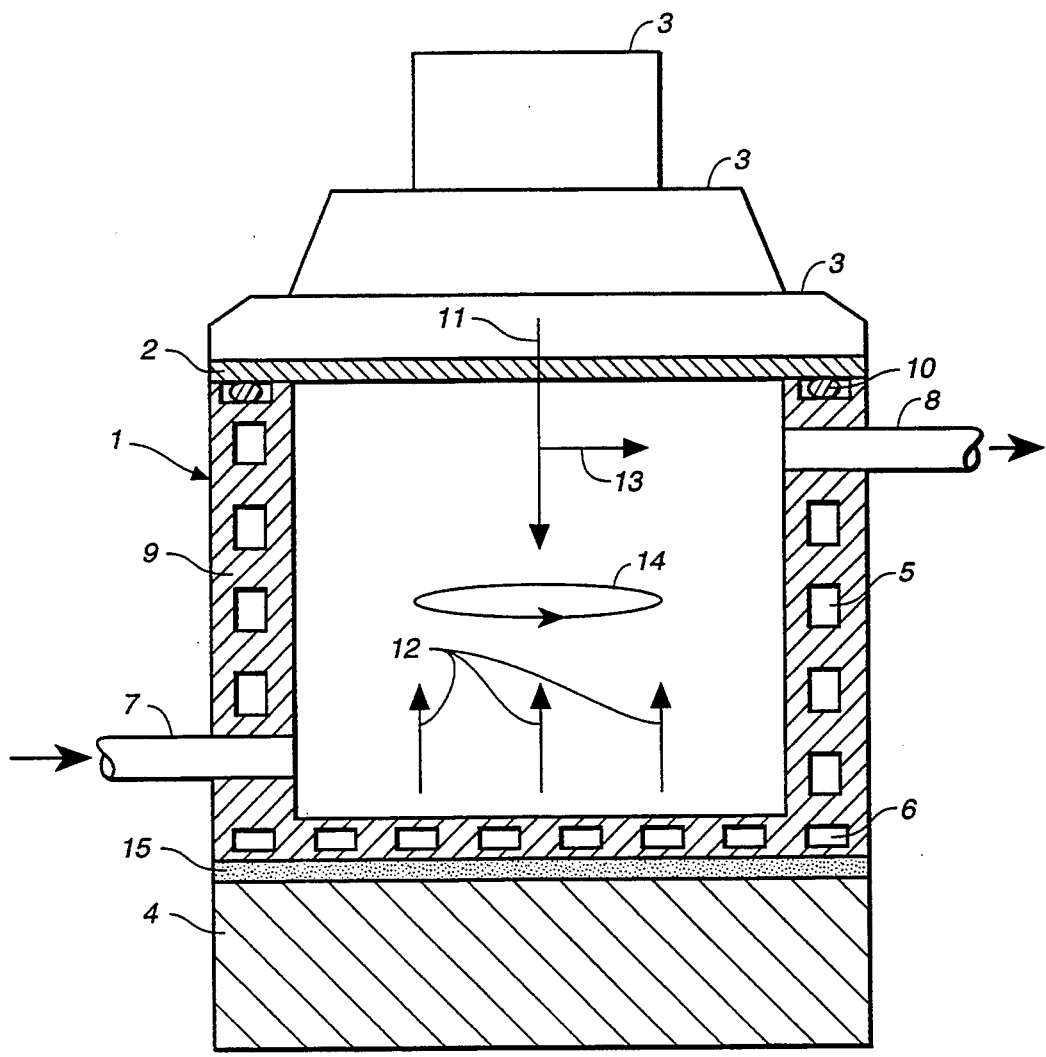
*FIG._1*
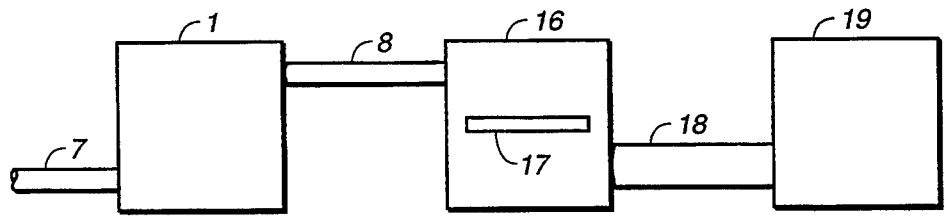
*FIG._2*

ECR PLASMA SOURCE FOR REMOTE PROCESSING

BACKGROUND OF THE INVENTION

The present invention is a device used to generate a gaseous plasma in which an oscillating electromagnetic field ionizes neutral species in the gas phase to form ions and electrons, excites neutral species to form electronically excited atoms and molecules, and dissociates molecules to form atoms and radicals. Industrial plasma processing involves the exposure of a workpiece to the plasma effluents in order to remove material from the substrate surface (etching), grow material on the substrate surface (deposition), chemically alter the surface (plasma oxidation, nitration, surface cleaning and passivation), physically modify the surface (surface roughing or smoothing), or generally modify the conditions on the surface or in the body of the workpiece (e.g. plasma sterilization). The utility of a plasma source relates for many applications to the density of charged particles in the plasma, ions and electrons. This density, in turn, is governed by the rate of production versus the rate of loss of ions and electrons. Plasmas and plasma sources are characterized and differentiated not only by the density of charged particles in the resulting plasma but in addition by the frequency of the generating electromagnetic field and by the range of gas pressure or vacuum suitable for its operation. The following review of prior art is limited to the technology associated with plasmas generated by microwaves of frequency 2.45 GHz.

ECR

In a plasma electrons oscillate with the electrical component of the generating electromagnetic field. The electrical as well as the magnetic vector is located in a plane perpendicular to the direction of propagation of the electromagnetic field. If a strong magnetic field is imposed on the plasma the electrons are forced to gyrate around the magnetic field lines with a rotation frequency determined by the strength of the magnetic field. The plane of rotation is perpendicular to the magnetic field lines. By proper adjustment of the electromagnetic frequency and magnetic strength the oscillation frequency due to the electromagnetic field and the gyration frequency caused by the superimposed magnetic field can be brought to coincide. This defines the special condition of electron cyclotron resonance, ECR. In addition to the matching of frequencies the spacial arrangement must be such that the electrical vector of the electromagnetic field is in the plane of gyration. This is the case when the microwave propagation is parallel with the magnetic field lines. The ECR condition is characterized by a drastically increased microwave power absorption by the plasma electrons resulting in much higher densities of charged particles and a much greater degree of dissociation in an ECR plasma than in a microwave plasma without the auxiliary magnetic field. Collisional scattering of electrons by neutrals will interfere with the electron gyration resulting in dampening of the effect as the gas pressure is raised. However, the effect is still substantial in helium at 1 torr as reported by B. Lax, P. Allis, and S. C. Brown, *J. Appl. Phys.*, 21, 1297 (1950).

Electromagnets

In practice, the necessary magnetic field can be produced either by an electromagnet or by a permanent magnet. By far the most common has been to use electromagnets. These magnets are usually in the shape of a solenoid which encloses the process chamber or part of the chamber, the plasma generating subchamber. In order to achieve adequate control of the shape of the magnetic field two or even three solenoid coils are used. This is exemplified by U.S. Pat. Nos. 4,876,983, 4,915,979, and 4,970,435. In order to produce a magnetic field of the proper strength currents in excess of 100 amps are needed in the coils producing heat and demanding elaborate cooling efforts. In addition, the circuitry to control the strength of the magnetic fields generated by the coils as well as the considerable size and weight of such electromagnets increase the cost of these systems very significantly. The size, or "footprint", is of particular concern in the semiconductor industry, where cleanroom space is at a premium.

Permanent magnets

Permanent magnets have been used in order to avoid the costly disadvantages of electromagnets. The problem now becomes one of placing the magnets sufficiently close to the plasma and the workpiece considering the rapid decay of the magnetic field strength with the distance from the magnet surface. In U.S. Pat. No. 4,433,228 the permanent magnet is placed in the microwave waveguide itself. While this arrangement brings the magnet very close to the workpiece it necessitates that the microwaves pass through the magnetic material thereby limiting the microwave power that can be applied in order to avoid destroying the magnet by the generated heat. In addition, the electromagnetic field of the microwave is perturbed by passage through the magnetic material. This disadvantage is avoided in U.S. Pat. No. 5,196,670 where the microwaves are brought in between the magnet and the quartz window allowing the microwaves to pass into the chamber without passing through the magnet. However, this effectively moves the magnet further away from the preferable location of the ECR plane in the chamber which, in turn, necessitates a considerably more powerful and costly magnet. Permanent magnets have also been used in connection with high density plasmas in order to reduce the rate of loss of electrons to the chamber walls by magnetic confinement. Here, the magnets function by repelling the electrons away from the walls back into the plasma. This is illustrated by U.S. Pat. No. 4,483,737, where the plasma source is a hot filament, and by U.S. Pat. No. 5,032,202, where the source is an electromagnetic ECR subchamber in U.S. Pat. No. 5,032,205 permanent magnets provide the necessary magnetic field for ECR operation and the plasma source is an RF electrode in the chamber itself. A similar setup is described in U.S. Pat. No. 4,745,337, where the in-chamber electrodes are microwave antennas.

Remote Processing

Remote processing here designates treatment of a substrate located outside the plasma excitation region in a separate, downstream processing chamber as opposed to and distinct from the in situ plasma generation chamber. There are a variety of industrial processes that involve the plasma activation of a gas or gas mixture, transport of the activated gas effluent to a downstream region, and reaction to deposit a film on a substrate, to remove or etch a surface layer from a substrate, or to chemically or physically alter or modify the surface or body of the substrate. The gas or gas mixture can be activated by a number of means such as a hot filament, a microwave discharge, a DC or RF discharge, and plasma jets or torches. U.S. Pat. No. 5,206,471 describes a microwave activated gas generator, in which the gas is passed through the MW waveguide in a quartz tube, but with no provisions for creation of ECR conditions and thus much less efficient. Another example is U.S. Pat. No. 5,115,166 using a plurality of similar microwave plasma generators, again unsuitable for ECR operation, employing the downstream processing region for substrate sterilization.

There is no prior art in the technology area known as reactive sputter deposition of optical thin films closely related to the present invention. Typically, a substrate is moved from a sputtering zone with an inert atmosphere, where the substrate is coated with a metal or metal alloy, to a reaction zone with a reactive and/or activated atmosphere, where the sputtered material is chemically altered to form the final film. The sputter zone is separated from the reaction zone by either physical means, as in U.S. Pat. No. 4,420,385, or by formation of concentration gradients of the proper chemicals, as in U.S. Pat. No. 4,851,095. Remote plasma activation of the gases flowing to the reaction zone is expected to accelerate the conversion of the sputtered film to the final, optically transparent film.

The design for in situ plasma sources has been greatly restricted by the need to make room for the workpiece in the process chamber. This concern has prevented the ideal design which would have the microwave field enter from one side of the chamber and a permanent magnet located on the opposite side thereby preserving the necessary parallelism between the magnetic field lines and microwave propagation. This design enables the magnet to be much closer to the plasma so that the necessary magnetic field can be achieved with a much smaller and less costly magnet. The present invention makes this ideal or optimal design possible by moving the workpiece completely out of the source chamber. Remote plasma sources are usually under restrictions too severe to allow for the cost and bulk of the traditional electromagnetic ECR source. The savings in production cost and in space requirements associated with the present invention will for the first time make a remote ECR plasma source production worthy.

SUMMARY OF THE INVENTION

It is an object of the present invention to provide a microwave plasma source, operating in the ECR mode, for remote processing.

It is also an object of the present invention to provide an ECR plasma source with smaller power consumption than comparable electromagnetic sources.

It is also an object of the present invention to provide an ECR plasma source with less magnetic material than comparable permanent magnet sources due to the simplicity of the present design which, in turn, is made possible by moving the substrate out of the source chamber.

It is a further object of this invention to provide an ECR plasma source at considerably lower cost than comparable electromagnetic sources.

It is also an object of the present invention to provide an ECR plasma source with a smaller volume than a comparable electromagnetic source.

It is a further object of the present invention to provide a plasma source which will function more reliably and with less maintenance than any comparable source.

It is a still further object of the present invention to provide a plasma source which assures reproducibility of processing more than any comparable source.

These objects are accomplished with the present invention which includes a plasma chamber equipped with a microwave transparent window and connected to a microwave waveguide that channels microwave energy through the window into the plasma chamber. The magnetic field necessary for ECR plasma conditions is provided by a block of permanent magnets located outside the chamber itself and on the opposite side of the chamber from the microwave window. Entrance and exit ports for a gas or gas mixture are located on the remaining unencumbered chamber sides such that gas molecules are forced to pass through the ECR surface in order to travel from entrance to exit port. This source chamber is intended to be coupled to a process chamber holding a workpiece such that the plasma activated effluent flows from the source chamber to the process chamber in order to modify the workpiece chemically or physically. The dimensions and material of the coupling as well as the nature of the interior surfaces are determined by the chemical system and the desired modification of the workpiece specific to a given technological application.

BRIEF DESCRIPTION OF THE DRAWINGS

FIG. 1 is a side view of the vertical cross section of the invention.

FIG. 2 is a block diagram illustrating application of the invention.

DESCRIPTION OF THE PREFERRED EMBODIMENT

The present invention is an ECR plasma source for remote processing and is illustrated in FIG. 1. It involves a vacuum chamber 1, a microwave transparent window or opening 2, a wave guide 3 for microwaves, a permanent magnet or composite magnet block 4, chamber cooling means 5, magnet cooling means 6, and entrance 7 and exit 8 ports for gas or gas mixture.

The plasma chamber 1 has a cylindrical sidewall 9 which is made hollow to accommodate cooling liquid constantly flowing through chamber cooling means 5 and magnet cooling means 6. The chamber 1 is constructed of non ferromagnetic metallic material or quartz, and made to tolerate total evacuation of the chamber. The top wall of the chamber 1 is flat and entirely or in part occupied by the microwave window 2 made of microwave transparent material like quartz or aluminum oxide. The window 2 is vacuum sealed to the chamber 1 with a metal o-ring 10 in order to permit evacuation of the chamber, to prevent leakage of radiation, and to withstand the plasma generated heat. Externally to the chamber 1 and located under the bottom of the chamber is a magnet or magnet pack 4 designed such that the magnetic field lines are perpendicular to the bottom of the chamber 1 as shown by arrows 12 and of such strength that the decaying field drops to about 875 Gauss in a plane in the middle of the chamber and parallel to the top and bottom, and the space so defined is often referred to as the ECR resonance plane. This can be created with a 4"×4"×1" block of 16 magnets, each measuring ½"×2"×1" and with a magnetic field of approximately 6,000 Gauss at the polar surface of the magnet. Here, the magnet is designed to create the conditions for resonance in a plane in the middle of the chamber. Other magnet designs are feasible resulting in non-planar resonance surfaces. The magnet pack 4 is protected from excessive heating by the plasma by having the wall between plasma chamber and magnet pack hollow to accommodate cooling liquid the same way as described for the sidewall. The interior surfaces of the chamber, except for the microwave window, are coated with a hard, wear resistant and inert coating the nature of which depends on the chemical system used in the plasma. The coating is designed to protect the chamber from chemical and physical attack by the plasma activated species and to minimize the deactivation and recombination of these species on the walls of the chamber.

The permanent magnet 4 is positioned below the chamber 1 with its N-S poles aligned with the propagation of the microwave field entering through the window 2 as shown by arrow 11. This geometry assures that the center magnetic field line is at right angle to the electric field associated with the microwaves.

The plasma source is operated by Introduction of a gas or gas mixture through entrance port 7 or a plurality of such ports, and the inlet flow and exit flow through port 8 is adjusted so as to keep the total pressure sufficiently reduced in order to limit collisional scattering of the gyrating electrons by neutrals, preferably below about 1 torr. The nature of the gas or gas mixture depends on the purpose of operation, e.g. Ar and $O_2$ for oxidation of an optical thin film, removal of photoresist on a semiconductor film, or plasma sterilization of a substrate in the medical industry, Ar and $SF_6$ or $NF_3$ for cleaning of a reactor for tungsten deposition, or He and $O_2$ or $H_2$ for deposition of silicon or silicon dioxide by remote plasma enhanced chemical vapor deposition (RPCVD). The microwave power supply (not shown) then generates microwaves which travel down the wave guide 3 and enter the chamber through window 2.

In the resulting microwave plasma electrons are accelerated by the electrical component of the electromagnetic field which oscillates in a plane perpendicular to the direction of propagation and this is indicated by arrow 13 in a magnetic field electrons gyrate around the magnetic field lines with a rotational frequency determined by and proportional with the strength of the magnetic field. The plane of rotation is perpendicular to the magnetic field lines as indicated by the circular arrow 14. By having the propagation of the microwave field parallel to the magnetic field lines the plane of the electrical field coincides spacially with the plane of gyration and it becomes possible for the microwave field and the magnetic field to cooperate in the acceleration of electrons. While the microwave frequency here is fixed at 2.45 GHz the magnetic field strength and therefore the gyration frequency decays monotonously with the distance from the magnet surface. Resonance between the electrical field oscillation and the magnetic field gyration occurs at 875 Gauss for the microwave frequency of 2.45 GHz. At this point the two forces are in phase and a drastically increased power absorption by the electrons becomes possible. This condition is termed electron cyclotron resonance or ECR. With the proper design of the magnet pack 4 this will occur in the center of the described plasma chamber 1 in a surface roughly parallel to the top and bottom of the chamber. The increased power absorption possible in the ECR surface will result in increased electronic excitation, ionization, and dissociation of the plasma gas.

Adjusting spacers 15 are placed between the magnet pack 4 and the plasma chamber 1 in order to be able to vary the spacial distance between the chamber and the magnet. By adjusting this distance, the precise location of the ECR resonance surface can be varied.

For the purpose of remote processing intended here the creation of ions and electrons is considered a necessary feature of operation of no consequence to the workpiece as the lifetime of these species under all operating conditions is too short to allow transport from the plasma chamber 1 to any process chamber. Electrons and ions are eliminated by recombination largely before exit from the source chamber and this results in generation of a large amount of heat. Thus, efficient cooling of the chamber and magnet is necessary. Atoms and radicals in their electronic ground states have much longer lifetimes than electrons and ions and some electronically excited neutrals likewise can be quite stable, sometimes labeled metastable species. Generally, the lifetime or stability depends on experimental conditions such as gas pressure and nature of gas phase collision partners as well as the dimensions and interior surface of the container. With the proper choice of these experimental conditions the plasma activated species can survive the transport from the source chamber to the process chamber to reach the workpiece and modify it as intended.

In order to ensure that all feed gas species benefit from the special conditions in the ECR resonance surface it is desirable to force the gas through this resonance surface by locating the gas inlet 7 on one side of the ECR resonance surface and locating the gas exit port 8 for the activated gas effluent on the side of the ECR resonance surface opposite the inlet port 7. Thus, if the inlet port 7 is located below the ECR resonance surface, then the exit port 8 is located above the ECR resonance surface, and vice versa.

With particular reference to FIG. 2, the practice of remote processing involves not only a vacuum or source chamber 1 described above and illustrated In FIG. 1, but in addition a process chamber 16, containing a workpiece or substrate 17, and a vacuum pump 19 which is capable of reducing the pressure in both the source chamber 1 and the process chamber 16 to at least $1 \times 10^{-4}$ torr. The source chamber 1 is operatively connected to the process chamber 16 through the gas exit port 8, and the process chamber 16 is operatively connected to the vacuum pump 19 by the gas conduit 18, which can be located opposite port 8.

In operation, a working feedgas or gas mixture is introduced to the source chamber 1 through gas entrance port 7. After plasma activation the gas effluent is transported from the source chamber 1 to the process chamber 16 through the exit port conduit 8 to act on the workpiece or substrate 17. Finally, the effluent is exhausted to the vacuum pump 19 through gas conduit 18. As described earlier for the source chamber, all interior surfaces in the process chamber 16 and the conduits 8 and 18 are coated with a hard, inert coating designed to protect the surfaces from chemical attack and to minimize loss of plasma activated species by deactivation or recombination on the surfaces.

The advantages associated with the present invention have been described above and can be reviewed as follows: The present invention does not consume any electrical power in order to provide the magnetic field needed for ECR functionality nor is any external circuitry needed to control the strength of this magnetic field. Generation of the magnetic field is not associated with any heat generation and no cooling is necessary other than protection of the magnet from other heat sources (i.e. the plasma). The permanency of the magnetic field assures reproducibility of processing and this is considered a very valuable characteristic of this source. By comparison with other ECR sources based on permanent magnets the present design has the advantage of being able to locate the magnet much closer to the plasma without putting the magnet in the path of the microwave field. This advantage originates with the removal of the workpiece from the plasma chamber. The proximity enables the establishment of the necessary magnetic field in the plasma with a much smaller and less expensive magnet than any previous design. The reduced cost of this invention is essential for it's exploitation as a plasma source for remote processing. ECR plasma sources have in the past most commonly been used for in situ processing of a workpiece, and these sources have been considered too costly to use for downstream or remote processing as disclosed here. The cost, bulk, and complexity of alternative sources explain the scarcity of prior art in the field of remote plasma processing and would suggest widespread application of the present invention in the technology areas of semiconductors, superconductors, optical thin films, and plasma sterilization.

The foregoing detailed description has been given for clarity of understanding only, and no unnecessary limitations should be infered therfrom, as some modifications will be obvious to those skilled in the art, Accordingly, the scope of the present invention is defined by the claims which follow.

What is claimed:

1. A plasma producing device for remote processing comprising:
    a chamber having at least one opening sealed by a window formed of microwave transparent material;
    means for transporting microwave energy having a direction of propagation and an associated electric field with said microwave energy through said opening and said window into said chamber;
    permanent magnet means having an axial magnetic field and located externally to said chamber and opposite to said window and with a north and south pole aligned such that the axial magnetic field of said magnet is parallel to the direction of propagation of microwaves entering said chamber wherein an ECR resonance surface is located within said chamber;
    an inlet port for feedgas mixture located on one side of said ECR resonance surface and an exit port for the activated gas effluent located on the side of said ECR resonance surface opposite to said inlet port;
    a process chamber operatively connected to said chamber through said exit port;
    a workpiece in said process chamber; and
    vacuum means operatively connected to said process chamber.

2. A plasma producing device for remote processing according to claim 1, the device further comprising:
    a hard, wear resistant coating on all appropriate internal surfaces designed to minimize loss of plasma activated species.

3. A plasma producing device for remote processing according to claim 1 wherein said vacuum means forces said feedgas mixture to pass through said ECR resonance surface.

4. A plasma producing device for remote processing according to claim 1 wherein said permanent magnet means are formed by a composite block of smaller magnets.

5. A plasma producing device for remote processing according to claim 1, the device further comprising:
    means for adjusting the distance between said permanent magnet means and said chamber while preserving the parallelism between the resulting magnetic field of said magnet means and the direction of propagation of said microwave field.

6. A plasma producing device for remote processing according to claim 1, the device further comprising:
    means for adjusting the precise location of said ECR resonance surface.

7. A plasma producing device for remote processing according to claim 1 wherein, said means for transporting microwave energy are connected to a microwave source which produces microwaves at about 2.45 GHz and said permanent magnet means produce a magnetic field of 875 Gauss in said chamber.

8. A plasma producing device for remote processing according to claim 1, the device further comprising:
    means for cooling the wall between said chamber and said magnet means in order to carry away heat generated by the plasma in said chamber.

* * * * *